(12) United States Patent
Yang et al.

(10) Patent No.: US 9,153,957 B2
(45) Date of Patent: Oct. 6, 2015

(54) ELECTROSTATIC DISCHARGE PROTECTION DEVICE AND METHOD FOR MANUFACTURING THE SAME

(71) Applicant: Samsung Electro-Mechanics Co., Ltd., Gyeonggi-do (KR)

(72) Inventors: Jin Hyuck Yang, Gyeonggi-do (KR); Young Seuck Yoo, Gyeonggi-do (KR); Sung Kwon Wi, Gyeonggi-do (KR); Geon Se Chang, Gyeonggi-do (KR); Ju Hwan Yang, Gyeonggi-do (KR); Young Do Kweon, Gyeonggi-do (KR); Jong Yun Lee, Gyeonggi-do (KR)

(73) Assignee: SAMSUNG ELECTRO-MECHANICS CO., LTD., Suwon-Si, Gyeonggi-Do (KR)

(*) Notice: Subject to any disclaimer, the term of this patent is extended or adjusted under 35 U.S.C. 154(b) by 134 days.

(21) Appl. No.: 13/830,978

(22) Filed: Mar. 14, 2013

(65) Prior Publication Data

US 2014/0055892 A1 Feb. 27, 2014

(30) Foreign Application Priority Data

Aug. 27, 2012 (KR) .......................... 10-2012-0093681

(51) Int. Cl.
| | |
|---|---|
| *H01H 47/00* | (2006.01) |
| *H02H 9/04* | (2006.01) |
| *C25D 3/30* | (2006.01) |
| *C23C 18/52* | (2006.01) |
| *H05K 1/02* | (2006.01) |
| *H01R 13/648* | (2006.01) |
| *H05K 9/00* | (2006.01) |

(52) U.S. Cl.
CPC ................ *H02H 9/044* (2013.01); *C23C 18/52* (2013.01); *C25D 3/30* (2013.01); *H01R 13/6485* (2013.01); *H05K 1/0259* (2013.01); *H05K 9/0067* (2013.01)

(58) Field of Classification Search
USPC ............................................ 361/56, 212, 220
See application file for complete search history.

(56) References Cited

U.S. PATENT DOCUMENTS

| | | | | |
|---|---|---|---|---|
| 2004/0222802 | A1* | 11/2004 | Chou et al. | 324/661 |
| 2010/0039745 | A1* | 2/2010 | Ryou et al. | 361/220 |
| 2011/0007439 | A1* | 1/2011 | Asakawa et al. | 361/56 |
| 2012/0187472 | A1* | 7/2012 | Chang et al. | 257/328 |

FOREIGN PATENT DOCUMENTS

| | | |
|---|---|---|
| JP | 2012-074228 | 4/2012 |
| WO | WO 2009/001649 A1 | 12/2008 |

* cited by examiner

*Primary Examiner* — Danny Nguyen
(74) *Attorney, Agent, or Firm* — McDermott Will & Emery LLP

(57) ABSTRACT

The present invention relates to an electrostatic discharge protection device. The electrostatic discharge protection device in accordance with an embodiment of the present invention includes a substrate, an electrostatic discharge absorbing layer having a plating film formed on the substrate, electrodes disposed on the substrate to be spaced apart from each other by a predetermined interval with the electrostatic discharge absorbing layer interposed therebetween, and an insulating layer for covering the substrate and the electrodes.

12 Claims, 4 Drawing Sheets

ELECTROSTATIC DISCHARGE PROTECTION DEVICE AND METHOD FOR MANUFACTURING THE SAME

CROSS-REFERENCE TO RELATED APPLICATIONS

Claim and incorporate by reference domestic priority application and foreign priority application as follows:

CROSS REFERENCE TO RELATED APPLICATION

This application claims the benefit under 35 U.S.C. Section 119 of Korean Patent Application Serial No. 10-2012-0093681, entitled filed Aug. 27, 2012, which is hereby incorporated by reference in its entirety into this application.

BACKGROUND OF THE INVENTION

1. Field of the Invention

The present invention relates to an electrostatic discharge protection device and a method for manufacturing the same, and more particularly, to an electrostatic discharge protection device with improved electrostatic discharge characteristics and a method for manufacturing the same.

2. Description of the Related Art

An electrostatic discharge protection device is widely used to protect predetermined electronic components from electrostatic discharge (ESD). A typical electrostatic discharge protection device consists of a device body, electrodes disposed on the device body to be spaced apart from each other by a predetermined gap, a functional layer filled between the electrodes, etc. The device body may be a ceramic sheet that consists primarily of alumina etc, a varistor sheet, low temperature co-fired ceramic (LTCC), etc. The electrodes are formed by performing a thin-film process, such as a sputtering process, on the device body. And the discharge layer is formed of a mixture of metal, insulator, epoxy, etc. Further, the functional layer is formed using a sputtering process or by mixing a conductive inorganic material with an insulating inorganic material.

RELATED ART DOCUMENT

Patent Document

Patent Document 1: Japanese Patent Application No. JP2009-520410

SUMMARY OF THE INVENTION

The present invention has been invented in order to overcome the above-described problems and it is, therefore, an object of the present invention to provide an electrostatic discharge protection device with improved electrostatic discharge characteristics and a method for manufacturing the same.

It is another object of the present invention to provide a method for manufacturing an electrostatic discharge protection device that can improve manufacturing process efficiency.

In accordance with one aspect of the present invention to achieve the object, there is provided an electrostatic discharge protection device including: a substrate; an electrostatic discharge absorbing layer having a plating film formed on the substrate; electrodes disposed on the substrate to be spaced apart from each other by a predetermined interval with the electrostatic discharge absorbing layer interposed therebetween; and an insulating layer for covering the substrate and the electrodes.

In accordance with an embodiment of the present invention, the electrostatic discharge absorbing layer may have a multilayer structure consisting of a plurality of metal layers.

In accordance with an embodiment of the present invention, the electrostatic discharge absorbing layer may have an embossed surface.

In accordance with an embodiment of the present invention, the electrostatic discharge absorbing layer may be provided on a boundary of the substrate and the insulating layer.

In accordance with an embodiment of the present invention, the insulating layer may have a plurality of resist patterns stacked on the substrate, the electrode portion may be formed over the resist patterns, and the electrostatic discharge absorbing layer may be provided on a boundary of the resist patterns.

In accordance with an embodiment of the present invention, the electrostatic discharge absorbing layer may include a first metal layer formed on the substrate and a second metal layer for covering the first metal layer, wherein the first metal layer may be made of at least one metal of palladium (Pd), rhodium (Rh), silver (Ag), gold (Au), cobalt (Co), and nickel (Ni), and the second metal layer may be made of tin (Sn).

In accordance with an embodiment of the present invention, the insulating layer may include a photosensitive resist pattern.

In accordance with another aspect of the present invention to achieve the object, there is provided a method for manufacturing an electrostatic discharge protection device, including the steps of: forming an electrostatic discharge absorbing layer by performing a plating process on a substrate; forming electrodes on the substrate to be spaced apart from each other by a predetermined interval with the electrostatic discharge absorbing layer interposed therebetween; and forming an insulating layer to cover the substrate and the electrodes.

In accordance with an embodiment of the present invention, the step of forming the electrostatic discharge absorbing layer may include the steps of forming a first metal layer on the substrate; and performing an electroless plating process using the first metal layer as a catalyst metal layer.

In accordance with an embodiment of the present invention, the step of forming the electrostatic discharge absorbing layer may include the step of performing a tin plating process of plating tin on the substrate using electricity.

In accordance with an embodiment of the present invention, the step of forming the electrostatic discharge absorbing layer may include the steps of forming a first metal layer on the substrate and performing a tin plating process using the first metal layer as a catalyst metal layer, wherein the step of performing the tin plating process may include the steps of preparing a plating solution including $SnCl_2$ as a tin source, ethylene diamine tetra-acetic acid (EDTA) and citrate as complexing agents, $NaBH_4$ as a reducing agent, and an accelerator; and performing an electroless plating process using the plating solution in a temperature range of about 20° C. to 80° C.

In accordance with an embodiment of the present invention, the step of forming the electrostatic discharge absorbing layer may be performed on the substrate before the step of forming the electrodes.

In accordance with an embodiment of the present invention, the step of forming the electrodes may include the steps of forming a lower electrode on the substrate and forming an upper substrate on the lower substrate, and the step of forming the electrostatic discharge absorbing layer may be performed before the step of forming the upper electrode after the step of forming the lower electrode.

In accordance with an embodiment of the present invention, the step of forming the insulating layer may include the steps of forming a photosensitive resist film on the substrate and patterning the photosensitive resist film.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
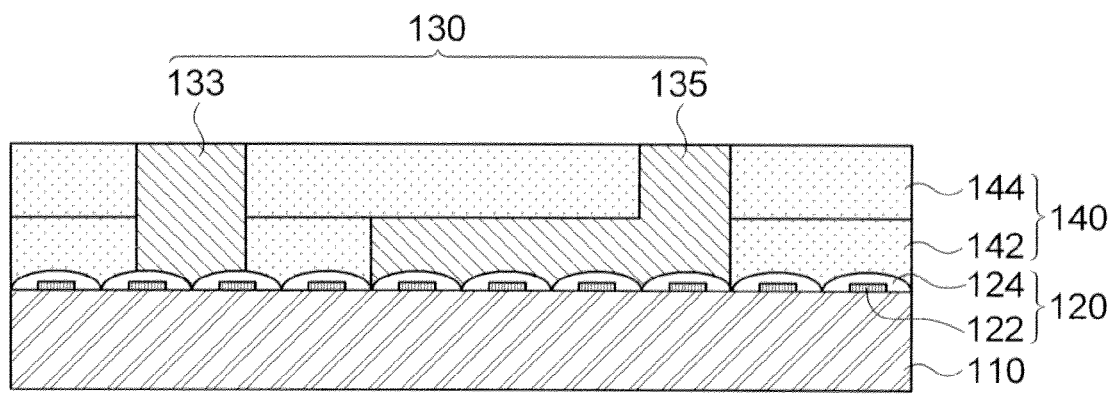
FIG. 1 is a view showing an electrostatic discharge protection device in accordance with an embodiment of the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Further, embodiments to be described throughout the specification will be described with reference to cross-sectional views and/or plan views, which are ideal exemplary drawings of the present invention. In the drawings, the thicknesses of layers and regions may be exaggerated for the effective explanation of technical contents. Therefore, the exemplary drawings may be modified by manufacturing techniques and/or tolerances. Therefore, the embodiments of the present invention are not limited to the accompanying drawings, and can include modifications to be generated according to manufacturing processes. For example, an etched region shown at a right angle may be formed in the rounded shape or formed to have a predetermined curvature.

Hereinafter, an electrostatic discharge protection device and a method for manufacturing the same will be described in detail with reference to the accompanying drawings.

FIG. 1 is a view showing an electrostatic discharge protection device in accordance with an embodiment of the present invention. Referring to FIG. 1, an electrostatic discharge protection device 100 in accordance with an embodiment of the present invention may include a substrate 110, an electrostatic discharge absorbing layer 120, an electrode portion 130, and an insulating layer 140.

The substrate 110 may be a predetermined insulating substrate. The substrate 110 may be a ceramic sheet, a varistor sheet, a liquid crystal polymer, etc. The electrostatic discharge absorbing layer 120 may be used as a functional layer for absorbing or blocking electrostatic discharge (ESD) between the electrodes 130, and the insulating layer 140 may cover the electrode portion 130 to protect the electrode portion 130.

Here, the electrostatic discharge absorbing layer 120 may be a result formed by performing a plating process. More specifically, the electrostatic discharge absorbing layer 120 may include a first metal layer 122 formed on the substrate 110 and a second metal layer 124 formed by performing a plating process using the first metal layer 122 as a seed layer. Accordingly, the electrostatic discharge absorbing layer 120 may have a metal multilayer structure consisting of the first metal layer 122 and the second metal layer 124. When the electrostatic discharge absorbing layer 120 is a result formed by performing an electroless plating process, the electrostatic discharge absorbing layer 120 may have an embossed surface with a plurality of convex portions on the substrate 110. Accordingly, the electrostatic discharge absorbing layer 120 may have a relatively wide surface area compared to an electrostatic discharge absorbing layer having a thin-film shape of a flat surface formed by performing a thin-film forming process such as a sputtering process.

Meanwhile, it may be preferred that the first metal layer 122 is made of a metal which has a double orbital to play a role of catalyst metal. For example, the first metal layer 122 may be made of at least one metal of palladium (Pd), rhodium (Rh), silver (Ag), gold (Au), cobalt (Co), tin (Sn), and nickel (Ni). The second metal layer 124, which is formed by performing an electroless plating process on the first metal layer 122, may be made of various kinds of metal. For example, the second metal layer 124 may be made of tin (Sn).

The electrode portion 130 may include a first electrode 133 and a second electrode 135 which are spaced apart from each other with the electrostatic discharge absorbing layer 120 interposed therebetween. The first and second electrodes 133 and 135 may be made of various kinds of metal. As an example, the first and second electrodes 133 and 135 may be metal patterns made of copper (Cu).

The insulating layer 140 may cover the substrate 110 and the electrode portion 130 to protect them. The insulating layer 140 may include a first insulating layer 142 and a second insulating layer 144 stacked on the first insulating layer 142. The insulating layer 140 may be made of a photosensitive resist material. That is, the first and second insulating layers 142 and 144 may be photosensitive resist patterns of similar or different compositions.

As described above, the electrostatic discharge protection device 100 in accordance with an embodiment of the present invention includes the electrostatic discharge absorbing layer 120 which is provided between the first and second electrodes 133 and 135 to absorb ESD, wherein the electrostatic discharge absorbing layer 120 may be a result formed by performing an electroless plating process. In this case, the electrostatic discharge absorbing layer 120 may have an embossed surface compared to an electrostatic discharge absorbing layer formed by performing a thin-film forming process such as a sputtering process. When the electrostatic discharge absorbing layer 120 has an embossed surface, it has a relatively large specific surface area compared to an electrostatic discharge absorbing layer having a flat surface to increase a moving path of a surge current, thus reducing resistance of a functional layer. Accordingly, the electrostatic discharge protection device in accordance with the present invention can improve electrostatic discharge characteristics by including the electrostatic discharge absorbing layer having a structure that can block a surge current in a relatively wide region.

Further, the electrostatic discharge protection device 100 in accordance with an embodiment of the present invention may use photosensitive resist as an insulating layer for insulating the electrode portion 130. In this case, the resist performs roles of an insulating layer and a pattern for forming an external electrode (not shown) at the same time. In addition, since the external electrode can be designed as a bottom electrode, it is possible to reduce a mounting area required when mounting the protection device 100. Accordingly, since the electrostatic discharge protection device in accordance with the present invention uses the photosensitive resist as the insulating layer for insulating the electrode portion, it is possible to form the pattern for forming the external electrode in the process of forming the photosensitive resist, and since the external electrode can be designed as a bottom electrode, it is possible to reduce the mounting area required when mounting the protection device.

Continuously, a process of manufacturing the electrostatic discharge protection device 100 in accordance with an embodiment of the present invention previously described with reference to FIG. 1. Here, a description overlapping with the electrostatic discharge protection device 100 described above will be omitted or simplified.

Figure 2:
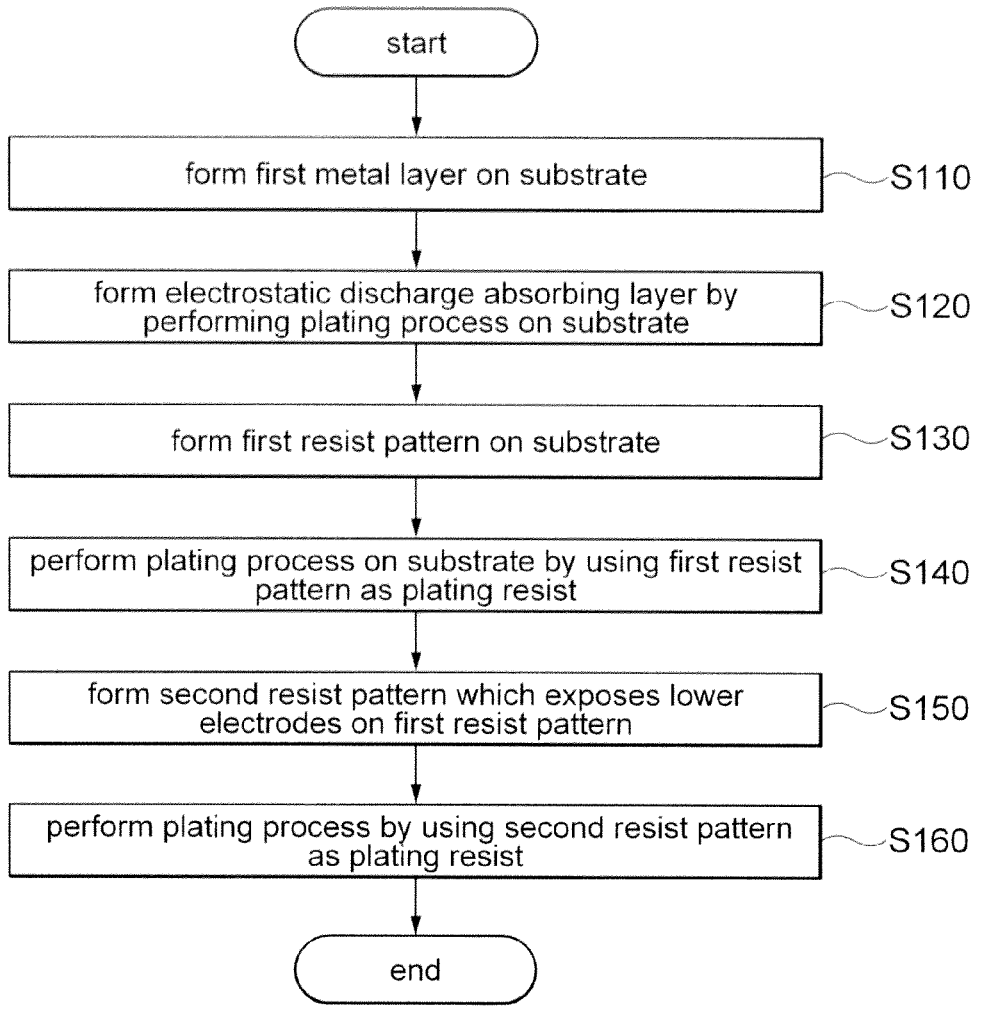
FIG. 2 is a flowchart showing a method for manufacturing an electrostatic discharge protection device in accordance with an embodiment of the present invention.
Figure 3:
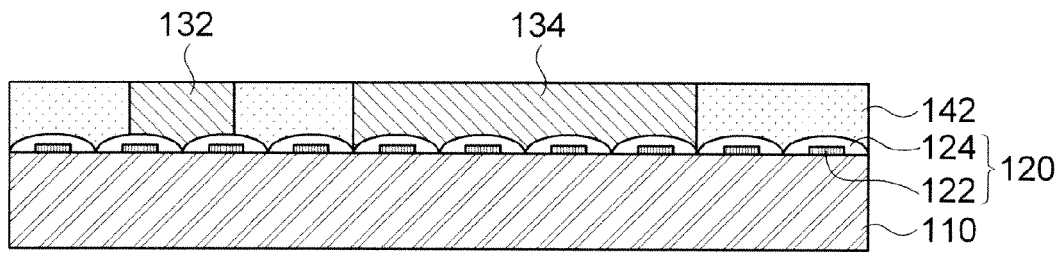
FIGS. 3 and 4 are views for explaining a process of manufacturing an electrostatic discharge protection device in accordance with an embodiment of the present invention.
Figure 4:
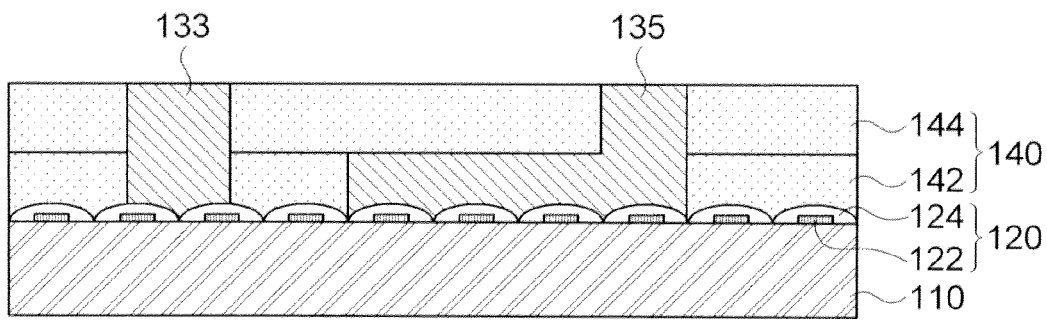

FIG. 2 is a flowchart showing a method for manufacturing an electrostatic discharge protection device in accordance with an embodiment of the present invention, and FIGS. 3 and 4 are views for explaining a process of manufacturing an electrostatic discharge protection device in accordance with an embodiment of the present invention.

Referring to FIGS. 2 and 3, a first metal layer 122 is formed on a substrate 110 (S110). Various kinds of insulating substrates may be used as the substrate 110. For example, the substrate 110 may be a ceramic sheet, a varistor sheet, a liquid crystal polymer, etc.

The step of forming the first metal layer 122 may include the step of performing a metal pretreatment process on the substrate 110. The step of performing the pretreatment process may be for forming a plating film on a surface of the insulating substrate. The pretreatment process may be a pretreatment process using at least one metal of palladium (Pd), rhodium (Rh), silver (Ag), gold (Au), cobalt (Co), tin (Sn), and nickel (Ni).

An electrostatic discharge absorbing layer 120 is formed by performing a plating process on the substrate 110 (S120). The step of forming the electrostatic discharge absorbing layer 120 may include the step of performing an electroless plating process using the first metal layer 122 as a seed layer on the substrate 110. As an example, the electroless plating process may be a tin plating process of plating tin on a specific object to be plated using electricity. A plating solution used in the tin plating may consist of $SnCl_2$ as a tin source, ethylene diamine tetra-acetic acid (EDTA) and citrate as complexing agents. $NaBH_4$ as a reducing agent, an accelerator, and other additives, and pH thereof may be adjusted to about 8 to 13. The plating process may be performed for about an hour in a plating process temperature condition of about 20° C. to 80° C. Through the above electroless plating process, the electrostatic discharge absorbing layer 120, which has an embossed surface as well as a multilayer structure consisting of the first and second metal layers 122 and 124, can be formed on the substrate 110.

A first resist pattern 142 is formed on the substrate 110 (S130). The step of forming the first resist pattern 142 may include the steps of forming a first resist film for covering the substrate 110 on which the electrostatic discharge absorbing layer 120 is formed and patterning the first resist film to expose a portion of the electrostatic discharge absorbing layer 120.

A plating process using the first resist pattern 142 as a plating resist is formed on the substrate (S140). The plating process may be an electroless plating process. Accordingly, a plating film is formed on the substrate 110 region exposed by the first resist pattern 142 so that lower electrodes 132 and 134 can be formed on the substrate 110 to be spaced apart from each other by a predetermined interval.

Referring to FIGS. 2 and 4, a second resist pattern 144, which exposes the lower electrodes 132 and 134, is formed on the first resist pattern 142 (S150). The step of forming the second resist pattern 144 may include the steps of forming a second resist film for covering the first resist pattern 142 and portions of the lower electrodes 132 and 134 and patterning the second resist film to expose the lower electrodes 132 and 134.

A plating process using the second resist pattern 144 as a plating resist is performed (S150). The plating process may be an electroless plating process. Accordingly, an electrode portion 130, which consists of first and second electrodes 133 and 135 formed by forming a plating film on the lower electrodes 132 and 134, can be formed on the substrate 110. The first and second electrodes 133 and 135 may be spaced apart from each other by a predetermined interval with the electrostatic discharge absorbing layer 120 interposed therebetween and covered with the first and second resist patterns 142 and 144 to be protected.

As described above, the method for manufacturing an electrostatic discharge protection device in accordance with an embodiment of the present invention can form the electrostatic discharge absorbing layer 120 by performing a plating process. In this case, it is possible to relatively reduce process costs and compensate an interval between the electrodes by adjusting an interval of the electrostatic discharge absorbing layer through a change of plating process conditions, compared to a method for forming an electrostatic discharge absorbing layer by a thin-film forming process such as a sputtering process. Accordingly, since the electrostatic discharge protection device and the method for manufacturing the same in accordance with the present invention form the electrostatic discharge absorbing layer as a functional layer by using a plating process rather than a thin-film forming process, it is possible to relatively reduce the process costs and compensate the interval between electrodes by changing the plating process conditions.

Further, since the method for manufacturing an electrostatic discharge protection device in accordance with an embodiment of the present invention uses photosensitive resist as an insulating material, it can have a relatively low curing temperature. In this case, it is possible to prevent a body from being influenced by vaporized materials in a process of discharging the vaporized materials generated when a solvent etc. included in a discharge medium are vaporized during a co-firing process as a subsequent process to the outside. In addition, since an insulating layer is formed of photosensitive resist, an external electrode can be implemented as a bottom electrode, thus reducing a mounting area when applied to set products.

Hereinafter, an electrostatic discharge protection device in accordance with another embodiment of the present invention will be described in detail. Here, a description overlapping with the electrostatic discharge protection device and the method for manufacturing the same in accordance with an embodiment of the present invention described above will be omitted or simplified.

Figure 5:
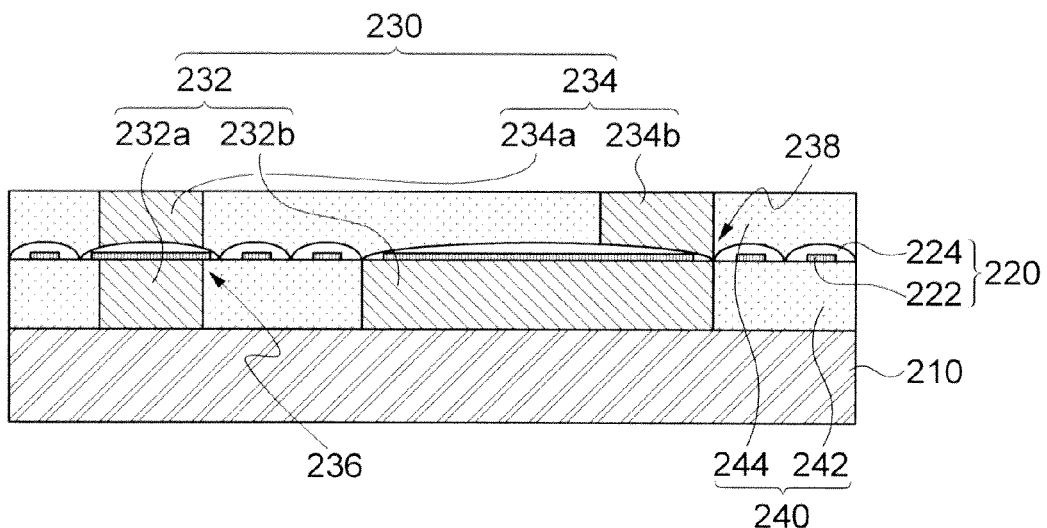
FIG. 5 is a view showing an electrostatic discharge protection device in accordance with another embodiment of the present invention.

FIG. 5 is a view showing an electrostatic discharge protection device in accordance with another embodiment of the present invention. Referring to FIG. 5, an electrostatic discharge protection device 200 in accordance with another embodiment of the present invention may include a substrate 210, an electrostatic discharge absorbing layer 220, an electrode portion 230, and an insulating layer 240.

The substrate 210 may be a predetermined insulating substrate. The electrostatic discharge absorbing layer 220 may be a functional layer for absorbing or blocking ESD between first and second electrodes 233 and 235 of the electrode portion 230, and the insulating layer 240 may consist of a third resist pattern 242 for covering the substrate 210 and a fourth resist pattern 244 for covering the third resist pattern 242 to cover the electrode portion 230.

The electrostatic discharge absorbing layer 220 may have a metal multilayer structure consisting of a third metal layer 222 and a fourth metal layer 224 which is a plating layer formed on the third metal layer 222. The electrostatic discharge absorbing layer 220, which is a result formed by performing an electroless plating process, may have an embossed surface.

The electrode portion 230 has a third electrode 236 and a fourth electrode 238 which are disposed on the substrate 210 to be spaced apart from each other, and the third and fourth electrodes 236 and 238 may be provided over the third and fourth resist patterns 242 and 244, respectively. More specifically, the electrode portion 230 may be divided into a lower electrode 232 and an upper electrode 234 which are disposed on the substrate 210 vertically. The lower electrode 232 may have first and second lower electrodes 232a and 232b which are disposed on the substrate 210 to be spaced apart from each other and surrounded by the third resist pattern 242. The upper electrode 234 may have a first upper electrode 234a which forms the third electrode 236 with the first lower electrode 232a and a second upper electrode 234b which is disposed on the second lower electrode 232b to form the fourth electrode 238 with the second lower electrode 232b. The first and second upper electrodes 234a and 234b may be surrounded by the first resist pattern 244 on the first lower electrode 232a.

Meanwhile, the electrostatic discharge absorbing layer 220 may be provided on a boundary of the third resist pattern 242 and the fourth resist pattern 244. In addition, the electrostatic discharge absorbing layer 220 may be provided on a boundary of the lower electrode 232 and the upper electrode 234. Accordingly, the electrostatic discharge absorbing layer 220 may be a functional layer disposed between the third and fourth electrodes 236 and 238. Here, a component with an ESD function is usually embedded in various components such as filters, and an ESD electrode is formed on a metal coil and a layer with various functions. However, the electrostatic discharge absorbing layer 220 is provided in an intermediate layer position inside the insulating layer 230 to prevent a surge current from penetrating into a coil and a layer provided on a lower layer compared to the electrostatic discharge absorbing layer 220 at the time of the penetration of the surge current.

As described above, the electrostatic discharge protection device 200 in accordance with another embodiment of the present invention may have the electrostatic discharge absorbing layer 220 provided on the boundary of the upper electrode 234 and the lower electrode 232. Accordingly, in the electrostatic discharge protection device in accordance with the present invention, since the electrostatic discharge absorbing layer is provided on the boundary of the lower electrode and the upper electrode in the intermediate portion of the insulating layer, it is possible to previously block the surge current before the surge current penetrates into the coil and the layer with various functions on the lower layer of the electrostatic discharge absorbing layer at the time of the penetration of the surge current, thus minimizing damage to the lower layer of the electrostatic discharge absorbing layer.

Further, in the electrostatic discharge protection device 200 in accordance with another embodiment of the present invention, the electrostatic discharge absorbing layer 220 may be provided on the boundary of the third resist pattern 242 and the fourth resist pattern 244. If the electrostatic discharge absorbing layer 220 is on the boundary of the substrate 210 and the third resist pattern 242, the electrostatic discharge absorbing layer 220 may deteriorate reliability of bonding or moisture absorption between the substrate 210 and the insulating layer 240. However, in the electrostatic discharge protection device in accordance with the present invention, since the electrostatic discharge absorbing layer is formed on a bonding surface of the resist pattern with a relatively high bonding strength due to a bonding strength of a polymer material, it is possible to prevent deterioration of reliability of bonding and moisture absorption occurring when the electrostatic discharge absorbing layer is provided between the substrate and the insulating layer.

Continuously, a process of manufacturing the electrostatic discharge protection device 200 described above with reference to FIG. 5 will be described in detail. Here, a description overlapping with the electrostatic discharge protection device described above will be omitted or simplified.

Figure 6:
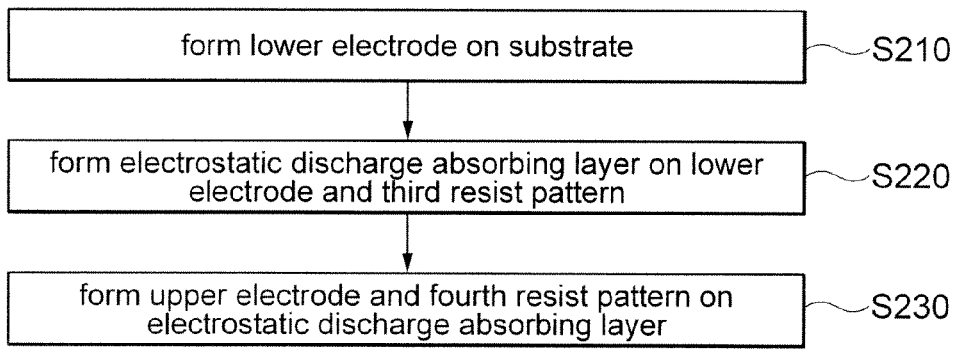
FIG. 6 is a flowchart showing a method for manufacturing an electrostatic discharge protection device in accordance with another embodiment of the present invention.
Figure 7:
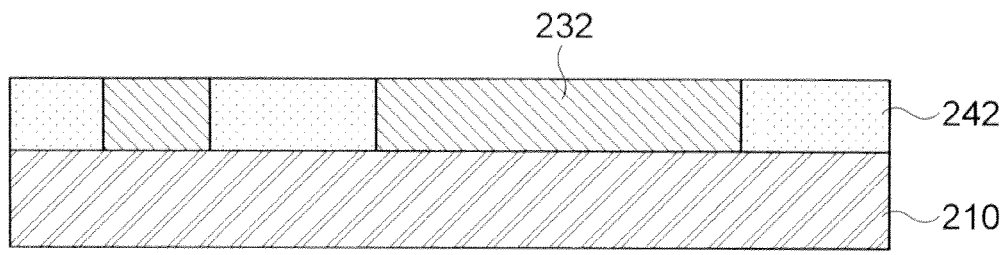
FIGS. 7 to 9 are views for explaining a process of manufacturing an electrostatic discharge protection device in accordance with another embodiment of the present invention.
Figure 8:
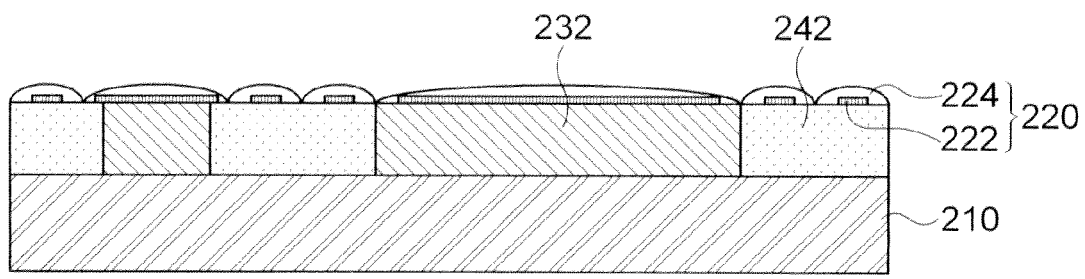
Figure 9:
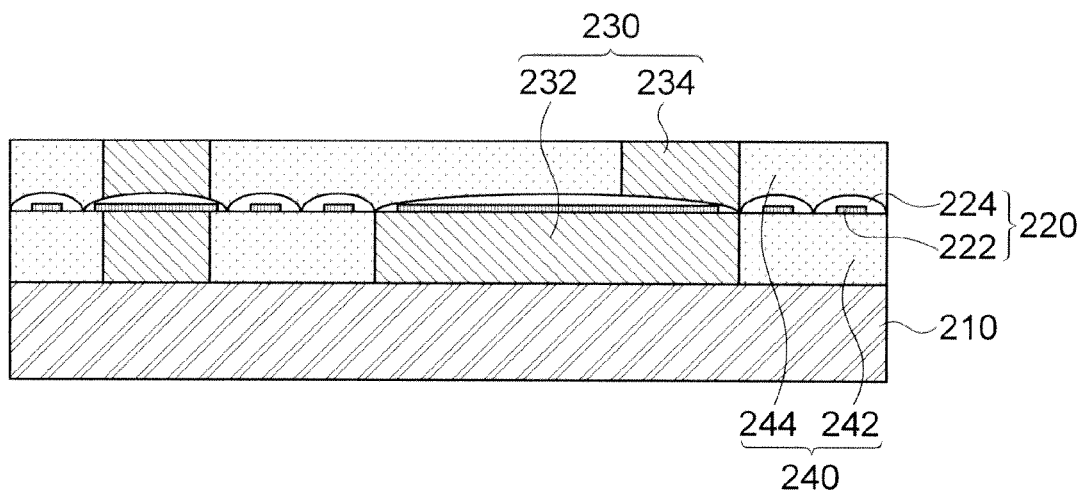

FIG. 6 is a flowchart showing a method for manufacturing an electrostatic discharge protection device in accordance with another embodiment of the present invention, and FIGS. 7 to 9 are views for explaining a process of manufacturing an electrostatic discharge protection device in accordance with another embodiment of the present invention.

Referring to FIGS. 6 and 7, a lower electrode 232 is formed on a substrate 210 (S210). The step of forming the lower electrode 232 may include the steps of pretreating the substrate 210, forming a seed layer on the substrate 210, forming a resist pattern for forming a pattern on the substrate 210, forming a seed layer pattern by performing a patterning process using the resist pattern, forming a third resist pattern 242 which exposes the seed layer pattern on the substrate 210, and performing an electroless plating process on the substrate 210 by using the third resist pattern 242 as a plating resist. Accordingly, the lower electrode 232 and the third resist pattern 242 which surrounds the lower electrode 232 can be formed on the substrate 210.

Referring to FIGS. 6 and 8, an electrostatic discharge absorbing layer 220 is formed on the lower electrode 232 and the third resist pattern 242 (S220). The step of forming the electrostatic discharge absorbing layer 220 may include the steps of forming a first metal layer 222 by performing a metal pretreatment process on the lower electrode 232 and the third resist pattern 242 and forming a second metal layer 224 which covers the first metal layer 222 by performing an electroless plating process. Accordingly, the electrostatic discharge absorbing layer 220, which has an embossed surface and consists of the first and second metal layers 222 and 224, can be formed on the lower electrode 232 and the third resist pattern 242.

Referring to FIGS. 6 and 9, an upper electrode 234 and a fourth resist pattern 244 are formed on the electrostatic discharge absorbing layer 220 (S230). The step of forming the upper electrode 234 may include the steps of forming a fourth resist film which covers the electrostatic discharge absorbing layer 220, forming a fourth resist pattern 244 which exposes the lower electrode 232 by patterning the fourth resist film, and forming a plating film on the lower electrode 232 by performing a plating process using the fourth resist pattern 244 as a plating resist. Accordingly, an electrostatic discharge protection device having an electrode portion 230 which consists of the lower electrode 232 and the upper electrode 234, the third resist pattern 242 which surrounds the lower electrode 232, the fourth resist pattern 244 which covers the third resist pattern 242 while surrounding the upper electrode 234, and the electrostatic discharge absorbing layer 220 formed on a boundary of the lower and upper electrodes 232 and 234 and on a boundary of the third and fourth resist patterns 242 and 244.

The electrostatic discharge protection device in accordance with the present invention can improve electrostatic discharge characteristics by including an electrostatic discharge absorbing layer which can block a surge current in a relatively wide region.

The electrostatic discharge protection device in accordance with the present invention can form an external electrode pattern in a process of forming photosensitive resist by using the photosensitive resist as an insulating layer for insulating an electrode portion and reduce a mounting area required when mounting the protection device by designing an external electrode as a bottom electrode.

The electrostatic discharge protection device and the method for manufacturing the same in accordance with the present invention can relatively reduce process costs by forming an electrostatic discharge absorbing layer, which is a functional layer, through a plating process rather than a thin-film forming process and compensate an interval between electrodes by changing plating process conditions.

The method for manufacturing an electrostatic discharge protection device in accordance with the present invention can prevent vaporized materials from influencing a body in a process of discharging the vaporized materials generated when a solvent etc. included in a discharge medium are vaporized during a co-firing process to the outside.

The method for manufacturing an electrostatic discharge protection device in accordance with the present invention can reduce a mounting area of the protection device when applying the protection device to set products by forming an insulating layer for covering an electrode portion with photosensitive resist and thus implementing an external electrode as a bottom electrode.

The electrostatic discharge protection device in accordance with the present invention provides an electrostatic discharge absorbing layer between resist patterns, which are a similar material to a photosensitive polymer. In this case, since a bonding strength between the resist patterns is relatively increased due to a bonding strength of the polymer material, it is possible to prevent deterioration of reliability occurring when the electrostatic discharge absorbing layer is provided between a substrate and an insulating layer.

The electrostatic discharge protection device in accordance with the present invention can minimize damage to a lower layer of an electrostatic discharge absorbing layer by providing the electrostatic discharge absorbing layer on a boundary of a lower electrode and an upper electrode in an intermediate portion of an insulating layer to previously block a surge current before the surge current penetrates into a coil and a layer with various functions on the lower layer of the electrostatic discharge absorbing layer at the time of the penetration of the surge current.

The electrostatic discharge protection device in accordance with the present invention can prevent deterioration of reliability of bonding and moisture absorption occurring when an electrostatic discharge absorbing layer is provided between a substrate and an insulating layer by forming the electrostatic discharge absorbing layer on a bonding surface of a resist pattern with a relatively high bonding strength due to a bonding strength of a polymer material.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An electrostatic discharge protection device comprising:
a substrate;
an electrostatic discharge absorbing layer having a plating film formed on the substrate;
an electrode portion comprising a plurality of electrodes disposed on the substrate to be spaced apart from each other by a predetermined interval with the electrostatic discharge absorbing layer interposed therebetween; and
an insulating layer for covering the substrate and the plurality of electrodes,
wherein the insulating layer has a plurality of resist patterns stacked on the substrate,
wherein the electrode portion is formed over the plurality of resist patterns, and
wherein the electrostatic discharge absorbing layer is provided on a boundary of the plurality of resist patterns.

2. The electrostatic discharge protection device according to claim 1, wherein the electrostatic discharge absorbing layer has a multilayer structure consisting of a plurality of metal layers.

3. The electrostatic discharge protection device according to claim 1, wherein the electrostatic discharge absorbing layer has an embossed surface.

4. The electrostatic discharge protection device according to claim 1, wherein the electrostatic discharge absorbing layer is provided on a boundary of the substrate and the insulating layer.

5. The electrostatic discharge protection device according to claim 1, wherein the electrostatic discharge absorbing layer comprises:
   a first metal layer formed on the substrate; and
   a second metal layer for covering the first metal layer, wherein the first metal layer is made of at least one metal of palladium (Pd), rhodium (Rh), silver (Ag), gold (Au), cobalt (Co), and nickel (Ni), and the second metal layer is made of tin (Sn).

6. The electrostatic discharge protection device according to claim 1, wherein the insulating layer comprises a photosensitive resist pattern.

7. A method for manufacturing an electrostatic discharge protection device, comprising:
   forming an electrostatic discharge absorbing layer by performing a plating process on a substrate;
   forming electrodes on the substrate to be spaced apart from each other by a predetermined interval with, the electrostatic discharge absorbing layer interposed therebetween; and
   forming an insulating layer to cover the substrate and the electrodes,
   wherein forming the electrodes comprises:
      forming a lower electrode on the substrate, and
      forming an upper substrate on the lower substrate,
   wherein forming the electrostatic discharge absorbing layer is performed before forming the upper electrode after forming the lower electrode.

8. The method for manufacturing an electrostatic discharge protection device according to claim 7, wherein forming the electrostatic discharge absorbing layer comprises:
   forming a first metal layer on the substrate; and
   performing an electroless plating process using the first metal layer as a catalyst metal layer.

9. The method for manufacturing an electrostatic discharge protection device according to claim 7, wherein forming the electrostatic discharge absorbing layer comprises performing a tin plating process of plating tin on the substrate using electricity.

10. The method for manufacturing an electrostatic discharge protection device according to claim 7, wherein forming the electrostatic discharge absorbing layer comprises:
   forming a first metal layer on the substrate; and
   performing a tin plating process using the first metal layer as a catalyst metal layer, wherein performing the tin plating process comprises:
      preparing a plating solution including $SnCl_2$ as a tin source, ethylene diamine tetra-acetic acid (EDTA) and citrate as complexing agents, $NaBH_4$ as a reducing agent, and an accelerator; and
      performing an electroless plating process using the plating solution in a temperature range of about 20° C. to 80° C.

11. The method for manufacturing an electrostatic discharge protection device according to claim 7, wherein forming the electrostatic discharge absorbing layer is performed on the substrate before forming the electrodes.

12. The method for manufacturing an electrostatic discharge protection device according to claim 7, wherein forming the insulating layer comprises:
   forming a photosensitive resist film on the substrate; and
   patterning the photosensitive resist film.

* * * * *